United States Patent [19]

Tomita

[11] Patent Number: 4,681,824

[45] Date of Patent: Jul. 21, 1987

[54] METHOD OF MANUFACTURING FLUORESCENT SCREENS OF COLOR PICTURE TUBES

[75] Inventor: Yoshifumi Tomita, Mobara, Japan

[73] Assignee: Hitachi, Ltd., Tokyo, Japan

[21] Appl. No.: 369,155

[22] Filed: Apr. 16, 1982

[30] Foreign Application Priority Data

Apr. 20, 1981 [JP] Japan ................................ 56-58531

[51] Int. Cl.$^4$ .............................................. G03C 5/00
[52] U.S. Cl. ........................................ 430/24; 430/25; 430/28; 430/29; 430/144; 430/291; 430/292
[58] Field of Search ...................... 430/24, 25, 28, 29, 430/144, 291, 292, 394

[56] References Cited

U.S. PATENT DOCUMENTS

| | | | |
|---|---|---|---|
| 3,365,292 | 1/1968 | Fiore et al. | 430/24 |
| 4,273,842 | 6/1981 | Nonogaki et al. | 430/25 |
| 4,324,850 | 4/1982 | Tomita et al. | 430/24 |
| 4,505,999 | 3/1985 | Bergamo et al. | 430/24 |

*Primary Examiner*—John L. Goodrow
*Assistant Examiner*—José G. Dees
*Attorney, Agent, or Firm*—Charles E. Pfund

[57] ABSTRACT

A fluorescent screen of a color picture tube is manufactured by the steps of forming a film of substance which becomes sticky when exposed to light on an inner surface of a panel of the tube, exposing predetermined portion of the film through a shadow mask to render sticky the exposed portions, repeatedly applying powders of phosphors of respective colors onto the portions which became sticky so as to form phosphor picture elements of respective colors, exposing portions of the film other than the predetermined portions to render them sticky, and applying a powder of graphite to the portions other than the predetermined portions to form a black matrix film.

5 Claims, 5 Drawing Figures

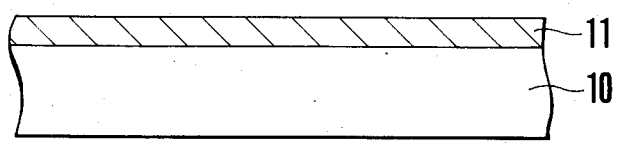
FIG.1
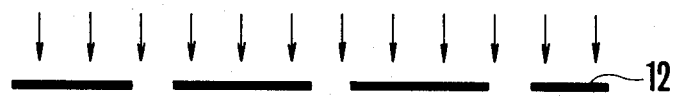
FIG.2
FIG.3
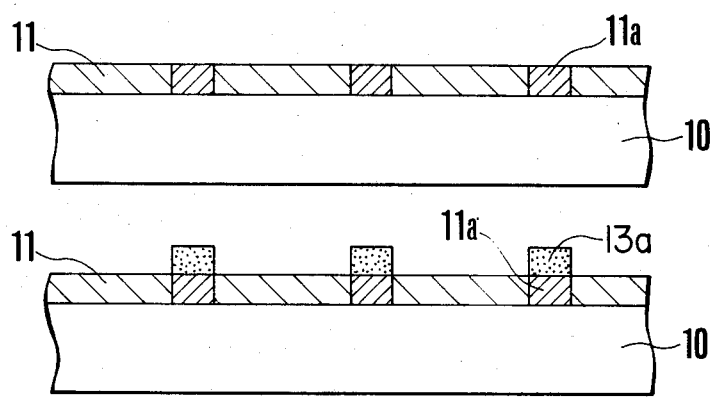
FIG.4
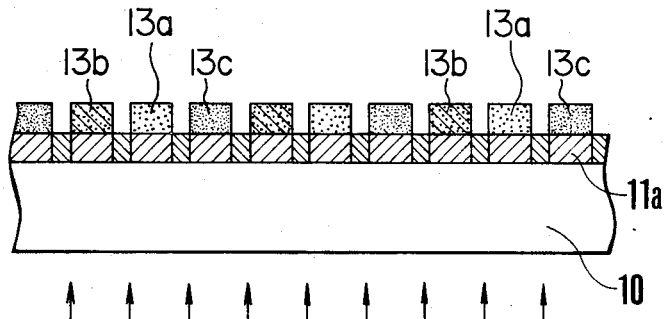
FIG.5
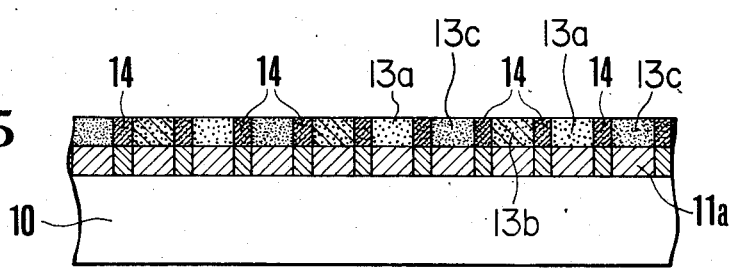

METHOD OF MANUFACTURING FLUORESCENT SCREENS OF COLOR PICTURE TUBES

BACKGROUND OF THE INVENTION

This invention relates to a method of manufacturing a black matrix type fluorescent screen of a color picture tube.

For the purpose of improving the contrast of the fluorescent screen of a color picture tube, the so-called black matrix type fluorescent screen is generally used in which spaces between picture elements consisting of phosphors of three colors, that is, green, blue and red are filled or coated with light absorbing substance.

Heretobefore, such a black matrix type fluorescent screen has been manufactured by coating onto the inner surface of the panel of the tube, a slurry prepared by admixing photosensitive liquid consisting of an aqueous solution of polyvinyl alcohol containing ammonium dichromate, with a phosphor and then exposing the coated slurry to light through a shadow mask, thus forming a picture element of a first color. Similar steps are repeated for other colors to prepare picture elements of three colors. Then, a photosensitive solution containing a fine powder of light absorbing substance, graphite for example, is applied onto the three color picture elements and then the coated film is exposed through the panel glass (back exposure) to fill the spaces between the picture elements with the light absorbing substance.

With this method, however, phosphor picture elements are composed of relatively large phosphor particles having a diameter of about 10 microns and moreover, since the picture elements are porous, light transmits through the picture elements at the time of back exposure. For this reason the light absorbing substance remains and fixes on the picture elements. This causes so-called a cross-contamination state, thereby greatly reducing the brightness of reproduced pictures. Furthermore, according to this method, since the phosphor slurry is applied and then exposed to form the picture elements, exposure light would be diffused by the phosphor particles, thus deforming the picture elements, which results in such disadvantages as nonuniformity in white field, and blur of reproduced picture.

Accordingly, at present, a method is widely used in which a black matrix film is firstly formed. With this method, since the particle size of the light absorbing substance is extremely small, the black matrix windows corresponding to the picture elements are sharply defined. Accordingly, it is possible to obtain a fluorescent screen having high quality.

According to this method, however, since it is necessary to remove the photosensitive resin film and the light absorbing substance thereon in order to form black matrix windows, the number of the manufacturing steps increases, thereby reducing productivity.

Incidentally, U.S. Pat. No. 4,273,842 of the same applicant of the present application discloses a fluorescent screen manufacturing method wherein high polymer solution of diazonium salt is coated on the panel inner surface of a tube to form a layer which is rendered sticky when exposed to light, and powder particles such as phosphors are sprayed onto portions of the layer rendered sticky as a result of exposure to complete a fluorescent screen. This method is of a simple dry process and may be applicable to the manufacture of various types of fluorescent screen.

SUMMARY OF THE INVENTION

Accordingly, it is an object of this invention to provide an improved method for manufacture based on the dry process, of a black matrix type fluorescent screen having excellent quality which can reduce the number of manufacturing steps.

Another object of this invention is to provide a fluorescent screen of a color picture tube having sharply defined picture elements and free from cross-contamination.

According to this invention, there is provided a method of manufacturing a fluorescent screen of a color picture tube, comprising the steps of forming a film of substance that becomes sticky when exposed to light on an inner surface of a panel of the tube, exposing predetermined portions of the film through a shadow mask to render sticky exposed portions, repeatedly applying powders of phosphors of respective colors onto the portions which became sticky so as to form phosphor picture elements of respective colors, exposing portions of the film other than the predetermined portion to render them sticky, and applying a powder of light absorbing substance to the portions of the film other than the predetermined portions to form a black matrix film.

BRIEF DESCRIPTION OF THE DRAWING

FIGS. 1 to 5 illustrate steps in the manufacture of a fuorescent screen according to the present invention.

DESCRIPTION OF THE PREFERRED EMBODIMENT

Referring to FIGS. 1 to 5, high polymer aqueous solution of diazonium salt is first coated onto the inner surface of a panel 10 of a color picture tube by spin coating to form a photosensitive sticky film 11 which becomes sticky when exposed to light as shown in FIG. 1. Then, the film 11 is exposed to light through a shadow mask 12 to render sticky exposed portions 11a of the film 11 as shown in FIG. 2. A powder of a phosphor of a first color, for example, green is sprayed onto the film 11 to make phosphor powder 13a sticked to the exposed portions 11a, and excess powder is removed by pressurized air to develope a picture element of the first color (FIG. 3). A similar process is repeated for red phosphor powder 13b and blue phosphor powder 13c to complete trios of phospher powder as shown in FIG. 4. Needless to say, the picture element may be in the form of either a dot or stripe. Subsequently, the film is exposed to light from rear side (back exposure) through the panel 10 to render sticky portions of the film 11 other than the picture elements (FIG. 4). A powder of light absorbing substance, for example, graphite is sprayed onto the portions which became sticky in the same manner as the powders of phosphors. Excess powder of graphite is removed with pressurized air to develope a black matrix film pattern 14 as shown in FIG. 5.

Since portions of the photosensitive sticky film not containing any phosphor are exposed to light for forming picture elements, exposure light does not diffuse and the pattern formed by light exposure is sharply defined and hence the phosphor picture elements are also sharply defined. Different from the prior art method, photosensitive liquid containing light absorbing substance is not coated on the phosphor picture elements.

In addition, where the photosensitive sticky film is rendered sticky by exposing it to light from rear side and then a powder of the light absorbing substance is sprayed, since phosphor powders have already been sticked to the portions corresponding to the picture elements, there is no fear for the light absorbing substance to adhere to and remain on the picture elements even when a simple total exposure is made. Moreover, once the photosensitive sticky film is formed, it is possible to form both the phosphor picture elements and the matrix film so that it is unnecessary to independently coat photosensitive liquid for the phosphor picture elements and the black matrix film.

The light absorbing substance sprayed on the photosensitive sticky film for the purpose of forming the black matrix film is not limited to such substance as graphite which absorbs light. For example, such substance as manganese carbonate which can be converted into light absorbing substance (manganese dioxide) can also be used. Back exposure is not always essential for the preparation of the black matrix film. In other words, light may be projected from inside of the panel.

As described above, according to this invention, steps of applying a film of substance that becomes sticky upon light exposure on the inner surface of the panel, exposing predetermined portions of the film, and applying a powder of a phosphor are repeated to form color picture elements. Thereafter, portions of the film not corresponding to the picture elements are exposed to light to render them sticky, and a powder of light absorbing substance is applied to form a black matrix film pattern. Consequently, it is possible to obtain a high quality fluorescent screen of a color picture tube in which picture elements are sharply defined and there is no cross-contamination. Moreover, the number of steps can be reduced.

What is claimed is:

1. A method of manufacturing a fluorescent screen of a color picture tube comprising the steps of:

forming a film of substance that becomes sticky when exposed to light on an inner surface of a panel of said tube;

exposing predetermined portions of said film through a shadow mask to render sticky exposed portions;

repeatedly applying powder of phosphors of respective colors onto the portions which became sticky so as to form phosphor picture elements of respective colors with said film uncovered between said formed picture elements;

exposing the uncovered portions of said film other than said predetermined portions to render them sticky without using the shadow mask; and finally applying a powder of light absorbing substance to said uncovered portions other than said predetermined portions to form a black matrix film.

2. The method according to claim 1 wherein said exposing the other portions is back exposure.

3. The method according to claim 1 wherein said substance that becomes sticky upon exposure comprises diazonium salt.

4. The method according to claim 1 wherein said light absorbing substance comprises graphite.

5. The method according to claim 1 wherein said light absorbing substance comprises manganese dioxide.

* * * * *